(12) United States Patent
Kim et al.

(10) Patent No.: US 9,269,453 B2
(45) Date of Patent: Feb. 23, 2016

(54) FUSE ARRAY (71) Applicant: SK hynix Inc., Gyeonggi-do (KR)

(72) Inventors: So-Young Kim, Gyeonggi-do (KR); Jae-Hong Jeong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 24 days.

(21) Appl. No.: 14/469,030

(22) Filed: Aug. 26, 2014

(65) Prior Publication Data

US 2015/0279477 A1  Oct. 1, 2015

(30) Foreign Application Priority Data

Mar. 28, 2014 (KR) .................. 10-2014-0036532

(51) Int. Cl.
*G11C 17/16* (2006.01)
(52) U.S. Cl.
CPC ...................... *G11C 17/16* (2013.01)
(58) Field of Classification Search
CPC .................................. H01L 23/5256
See application file for complete search history.

(56) References Cited

U.S. PATENT DOCUMENTS

| 2012/0057423 A1* | 3/2012 | Chen | G11C 17/165 365/225.7 |
| 2013/0279282 A1* | 10/2013 | Kim | G11C 17/16 365/207 |
| 2014/0071779 A1* | 3/2014 | Son | G11C 17/16 365/225.7 |
| 2014/0071780 A1* | 3/2014 | Son | G11C 17/16 365/225.7 |

FOREIGN PATENT DOCUMENTS

KR    101104643    1/2012

* cited by examiner

*Primary Examiner* — Lex Malsawma
(74) *Attorney, Agent, or Firm* — IP & T Group LLP (57) ABSTRACT

A fuse array may include: an E-fuse including a plurality of active regions having a floating node and a contact node, and a plurality of gates overlapping the respective active regions and separated from each other between the floating node and the contact node; and a plurality of fuse sets each including two or more E-fuses and sharing the floating node or the contact node.

20 Claims, 4 Drawing Sheets

FUSE ARRAY

CROSS-REFERENCE TO RELATED APPLICATIONS

The present application claims priority of Korean Patent Application No. 10-2014-0036532, filed on Mar. 28, 2014, which is incorporated herein by reference in its entirety.

BACKGROUND

1. Field

This patent document relates to a semiconductor technology and, more specifically, to a fuse array that includes a plurality of programmable E-fuses.

2. Description of the Related Art

Research is constantly conducted with the goal of increasing the degree of integration and reducing the size of semiconductor devices. E-fuses, which are usually arranged in a two-dimensional array, are a medium in which information may be stored in a semiconductor device. The inventive concept set forth herein is directed at increasing the integration density, reducing the size, and improving the signal transmission characteristics of an E-fuse array.

SUMMARY

Various embodiments are directed to a method for improving the integration degree and signal transmission characteristics of a fuse array including a plurality of programmable E-fuses.

In an embodiment, a fuse array may include a plurality of fuse sets each including two or more E-fuses that share a floating node or a contact node, wherein each E-fuse has an active region where the floating node and the contact node are disposed, and two gates overlapping the active region and separated from each other between the floating node and the contact node.

Another embodiment may include a fuse array which including a plurality of first fuse sets each having two of more E-fuses sharing a floating node and a plurality of second fuse sets each having two or more E-fuses sharing a contact node, wherein the plurality of first fuse sets and the plurality of second fuse sets are arranged in a staggered fashion in a first direction and in a line in a second direction. The E-fuses may have first and second gates overlapping their respective active regions and the gates may be separated from each other between the floating node and the contact node.

In an embodiment, there is provided a fuse array which includes a plurality of active regions each having both ends defined as floating nodes or contact nodes, a plurality of E-fuses having first and second gates overlapping the respective active regions and separated from each other between the floating node and the contact node, a plurality of first fuse sets each having two or more E-fuses sharing the floating node, and a plurality of second fuse sets each having two or more E-fuses sharing the contact node. The plurality of first fuse sets and the plurality of second fuse sets may be arranged in a staggered fashion in a first direction and in a line in a second direction and the fuse array may include: a plurality of first conductive lines extended in the first direction wherein the conductive lines are coupled to the plurality of first gates; a plurality of second conductive lines extended in the first direction and coupled to the plurality of second gates; and a plurality of strapping contact plugs coupled to the first and second conductive lines between the plurality of first fuse sets and the plurality of second fuse sets in a second direction crossing the first direction.

Another embodiment may include a fuse array which including a substrate having active regions; E-fuses that are formed over the active regions, wherein each of the E-fuse includes a contact node, a floating node, and at least one gate; E-fuse sets that include two or more of the E-fuses, wherein each of the E-fuse sets share either the contact node or the floating node, and the E-fuse sets are positioned in a staggered fashion when viewed from a first direction; conductive lines that extend in the first direction that are connected to the gates of the E-fuses; and strapping contact plugs that are coupled to the conductive lines, wherein the contact plugs are disposed between the E-fuse sets.

The E-fuse sets may include first fuse sets and second fuse sets; the first fuse sets share a floating node and the second fuse sets share a contact node; and the first fuse sets and the second fuse sets are arranged alternately in a second direction, which crosses the first direction. The first fuse sets may include first gates and second gates, the first gates are positioned to face each other around the floating node that is shared, and the second gates are at opposite ends of the first fuse sets to surround the first gates; and the second fuse sets include first gates and second gates, the second gates are positioned to face each other around the contact node that is shared, and the first gates are at opposite ends of the first fuse sets to surround the first gates. The conductive lines include first conductive lines and second conductive lines, the first conductive lines connect first gates from both the first fuse sets and the second fuse sets, and the second conductive lines connect second gates from both the first fuse sets and the second fuse sets. The strapping contact plugs may include a first type strapping contact plugs and second type strapping contact plugs; the first gates are program gates, and the first conductive lines are program lines; the second program gates are select gates and the second conductive lines are select lines; the first type strapping contact plugs are coupled to the first gates of both first fuse sets and the second fuse sets, and are suitable for biasing a program voltage; and the second type strapping contact plugs are coupled to the second gates of both the first fuse sets and the second fuse sets, and are suitable for biasing a select voltage.

DETAILED DESCRIPTION

Various embodiments of the present invention are described below in detail with reference to the accompanying drawings.

The drawings may not be to scale and, in some instances, proportions of the structures in the drawings may be exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but this may also represent a structure where one or more other intermediate layers exist between the first layer and the second layer or the substrate.

The embodiments of the present invention provide a method for improving the integration degree and signal transmission characteristics of a fuse array including a plurality of programmable E-fuses. The embodiments of the present invention provide a fuse array in which a plurality of first fuse sets sharing a floating node and a plurality of second fuse sets sharing a contact node are arranged in a staggered fashion, and a strapping contact plug that is coupled to a conductive line extended between the first fuse sets and the second fuse sets.

First before embodiments of the present invention are described, a comparative example of a fuse array will be described with reference to FIG. 1.

Figure 1:
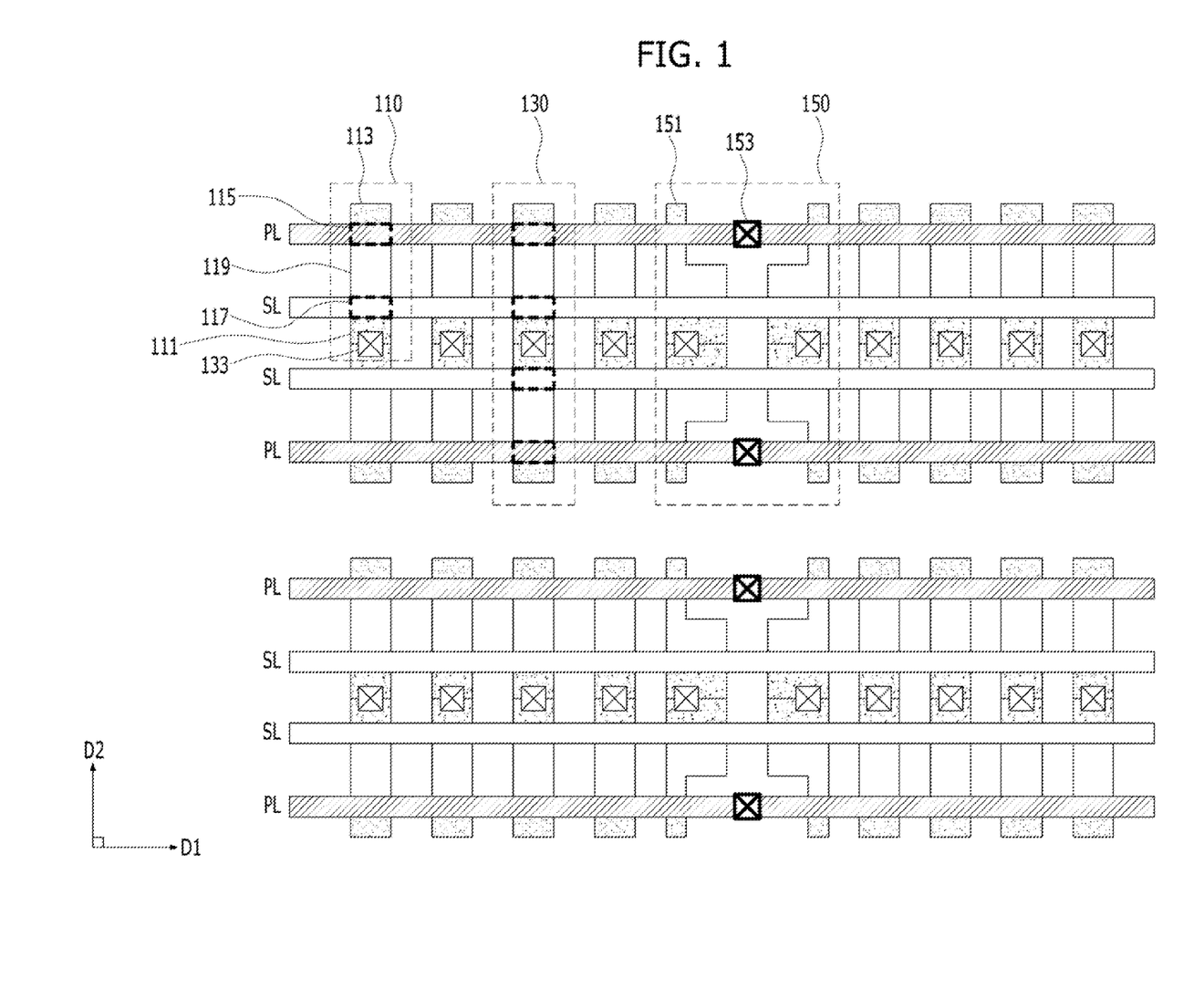
FIG. 1 is a plan view of a fuse array that serves as a comparative example.

FIG. 1 is a plan view of a comparative example fuse array.

As illustrated in FIG. 1, the comparative example fuse array includes a plurality of fuse sets 130 arranged in a 2D matrix and a strap region 150 for grouping the fuse sets 130. Each of the fuse sets 130 includes a plurality of E-fuses 110 sharing a contact node 111. For example, each of the fuse sets 130 may include two E-fuses 110 sharing a contact node 111.

In the comparative example, the E-fuse 110 includes transistors. Specifically, the E-fuse 110 may include a program transistor for storing data and a select transistor for selecting any one of a plurality of E-fuses 110. The program transistor and the select transistor share a junction region.

The program transistor includes a program gate 115, and the program gate 115 is coupled to a program line PL to receive a voltage for programming the E-fuse 110. The select transistor includes a select gate 117, and the select gate 117 is coupled to a select line SL to receive a voltage for selecting any one of the plurality of E-fuses 110.

The E-fuse 110 includes an active region 119, a program gate 115, and a select gate 117. The active region 119 is defined by an isolation layer(not shown) formed in a substrate, and has one end serving as a contact node 111 and one end serving as a floating node 113. The program gate 115 and the select gate 117 are formed over the substrate to overlap the active region 119, are positioned between the contact node 111 and the floating node 113, and are separated from each other. The program gate 115 is disposed adjacent to the floating node 113. The select gate 117 is disposed adjacent to the contact node 111. A gate dielectric layer (not illustrated) is formed between the program gate 115, the select gate 117, and the substrate, and whether the E-fuse 110 is programmed may be determined by whether the gate dielectric layer is broken-down(i.e., shorted).

In the comparative example, the fuse set 130 includes two E-fuses 110 sharing a contact node 111. Thus, each fuse set 130 includes two select transistors sharing a contact node 111 and two program transistors each having a separate floating node 113. A bit line(not shown) is coupled to the contact node 111 that is shared by the select transistors. The two program transistors include program gates 115 disposed adjacent to the respective floating nodes 113. The two select transistors include select gates 117 disposed adjacent to the contact nodes 111.

The fuse sets 130 are disposed in such a manner that the contact nodes 111 thereof connected with each other in a first direction D1, and a via contact plugs 133 that are formed over the contact nodes 111. The contact plugs 133 serve to electrically couple the bit lines(not shown) and the fuse sets 130. Surrounding on the contact plugs 133, two E-fuses are arranged symmetrically with each other in a second direction D2.

In the comparative example, the plurality of fuse sets 130 are arranged so that they are separated in the first and second directions D1 and D2. In the first direction D1, the strap region 150 is disposed between groups of fuse sets 130. The program lines PL and the select lines SL extend in the first direction D1 and couple the program gates 115 and the select gates 117 of the fuse sets 130, respectively. Furthermore, the contact plugs 133 that are arranged in a line in the first direction D1 are coupled to a bit line (not illustrated).

In the fuse array, the strap region 150 groups together multiple fuse sets 130. The strap region 150 includes dummy active regions 151 and a strapping contact plug 153 for strapping the program lines PL that are extended in the first direction D1. The strapping contact plug 153 is disposed between the dummy active regions 151, and contacts the program line PL over the isolation layer. The strapping contact plug 153 serves to compensate for a voltage drop in the program line PL. Specifically, the fuse array includes a plurality of fuse sets 130, and the program gates 115 formed in the respective fuse sets 130 are coupled to the program line PL extended in the first direction D1. When a voltage is applied to a program line PL of the fuse array, the voltage applied to the program line PL may drop because many program gates 115 are electrically coupled to one program line PL. That is, some of the program gates 115 may receive an abnormally low voltage because of a drop in voltage in the program line PL. The inability to deliver sufficient voltage may result in the program transistors being unable perform a normal program operation. Thus, the strap region 150 is required to compensate for the voltage drop of the program line PL. As described above, the strap region 150 includes a strapping contact plug 153 formed in the middle of the program line PL, which is extended in the first direction D1 and it applies a bias to the strapping contact plug 153 to compensate for a voltage drop occurring in the program line PL. In order to form the strap region 150 in the fuse array, the interval between the active regions 119 of the fuse sets 130 that are adjacent to the strap region 150 needs to be increased. Thus, in order to achieve a consistent pattern of active regions 119, dummy active regions 151 need to be formed in the strap region 150.

In the fuse array of the comparative example, a plurality of fuse sets 130 share contact nodes 111. The plurality of fuse sets 130 sharing contact nodes 111 are extended in the first direction D1 and, a plurality of program gates 115 are coupled to one program line PL. The strap region 150 is required to compensate for the voltage drop of the program line PL when the program voltage for programming the fuse array is applied. However, since the strap region 150 is formed in the middle of the fuse array in which a plurality of fuse sets are uniformly arranged, the integration degree of the fuse array may be reduced. Furthermore, when the strap region 150 is formed, the interval between the active regions 119 that are adjacent to the strap region 150 needs to be increased, and the dummy active regions 151 are formed to secure process margin. Thus, the integration degree of the fuse array is further reduced.

The embodiments of the present invention provide a fuse array with an improved degree of integration. In the fuse array, a mixture of fuse sets sharing floating nodes and fuse sets sharing contact nodes may be used. Furthermore, fuse sets sharing floating nodes and fuse sets sharing contact nodes may be arranged in a staggered fashion. Thus, although no strap region is formed, it is possible to compensate for a voltage drop in conductive lines and increase the integration degree of the fuse array.

Hereafter, a fuse array in accordance with an embodiment of the present invention will be described in detail.

Figure 2:
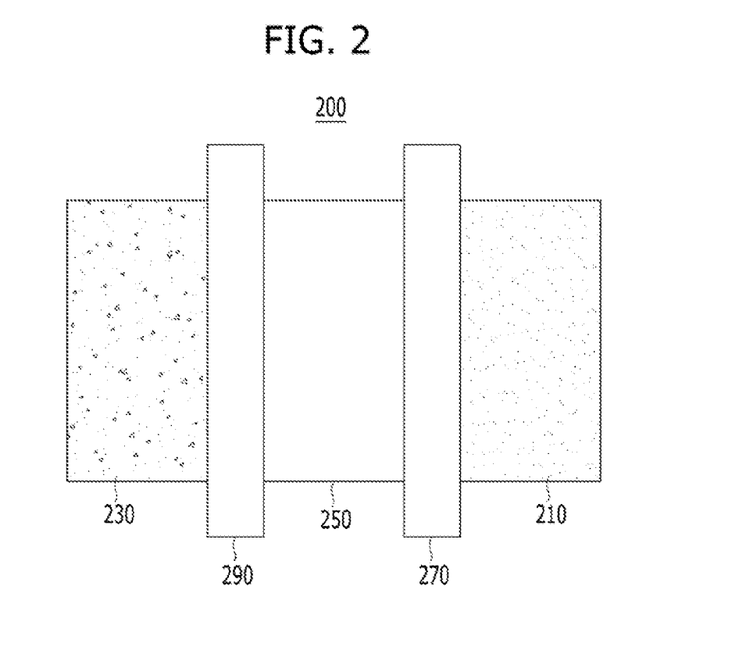
FIG. 2 is a plan view of an E-fuse in accordance with an embodiment of the present invention.
Figure 3A:
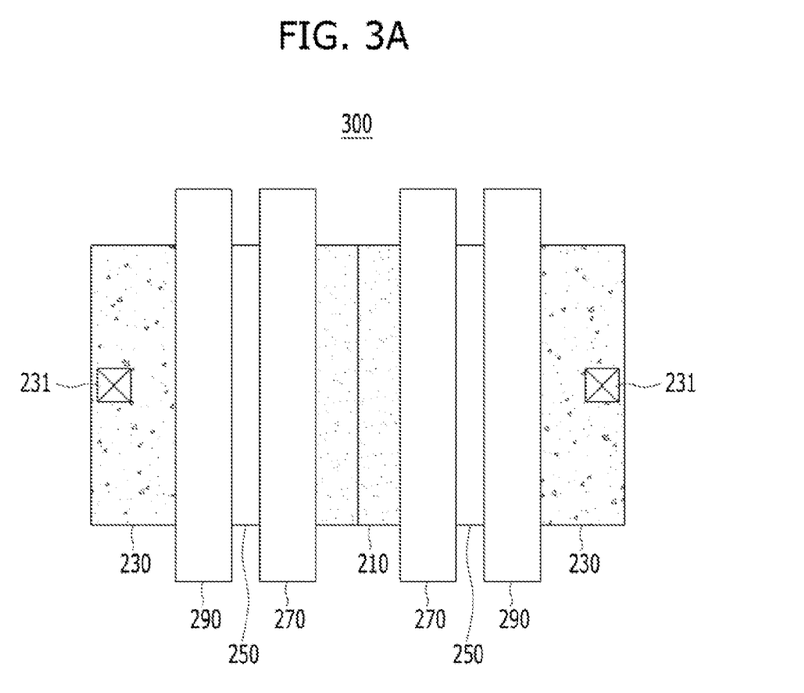
FIG. 3A is a plan view of a fuse set including a plurality of E-fuses of which floating nodes are shared.
Figure 3B:
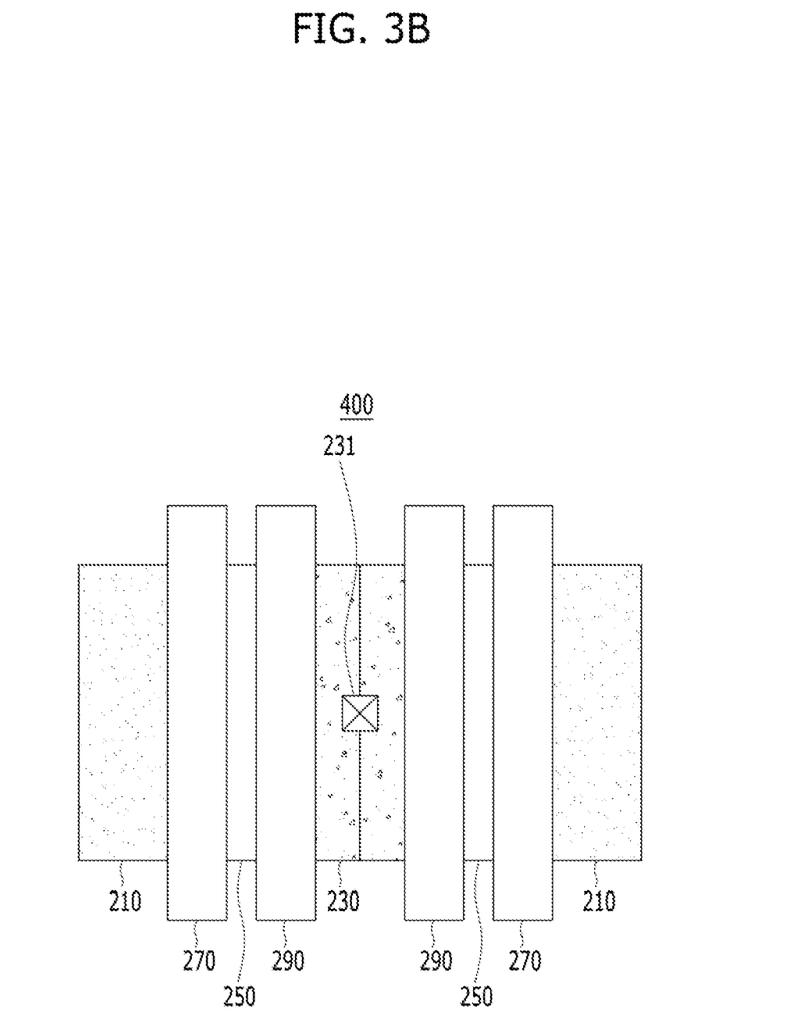
FIG. 3B is a plan view of a fuse set including a plurality of E-fuses of which contact nodes are shared.
Figure 4:
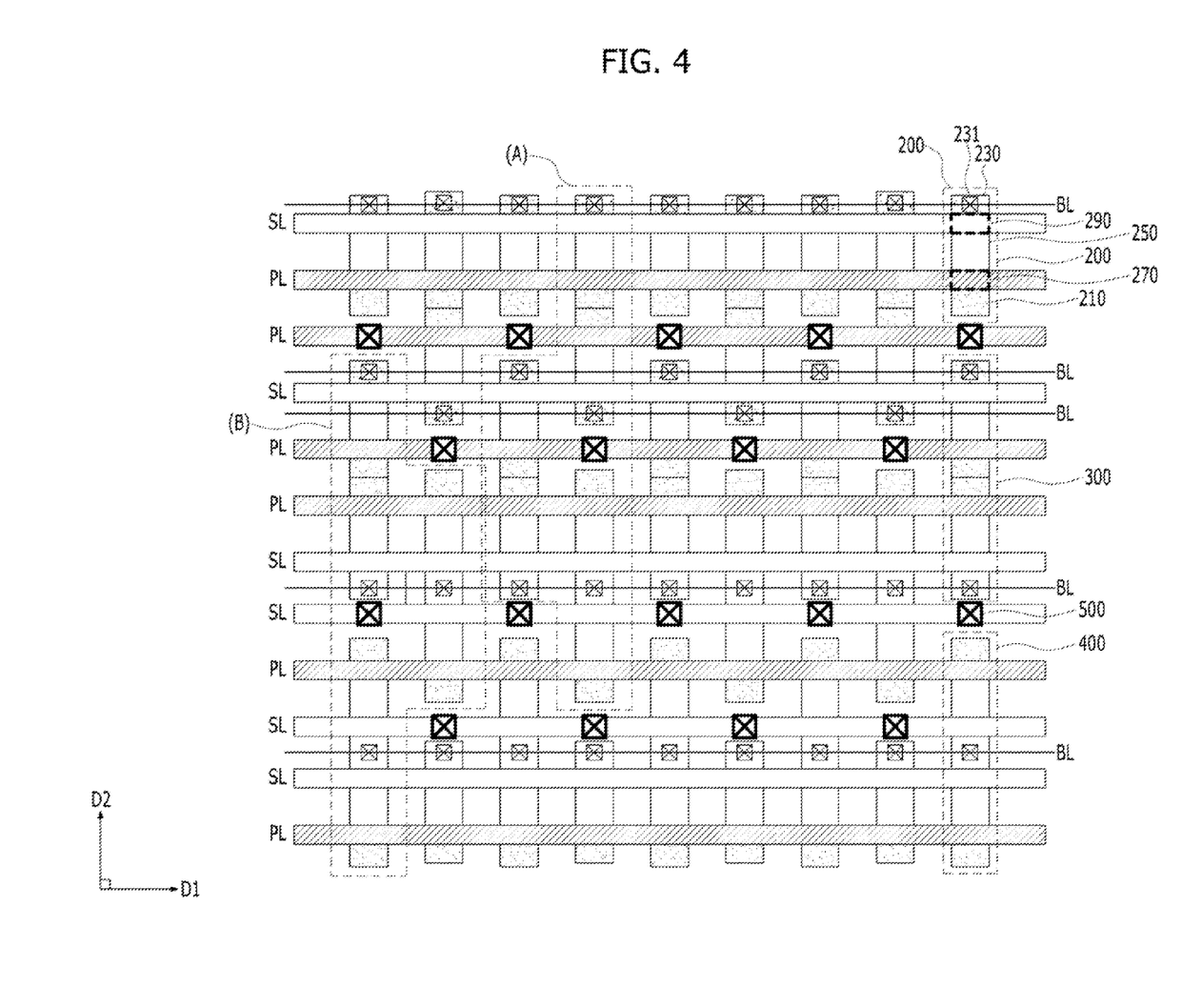
FIG. 4 is a plan view of a fuse array in accordance with an embodiment of the present invention.

FIG. 2 is a plan view of an E-fuse in accordance with an embodiment of the present invention. FIG. 3A is a plan view of a fuse set including a plurality of E-fuses that share a floating nodes. FIG. 3B is a plan view of a fuse set including a plurality of E-fuses that share a contact nodes. FIG. 4 is a plan view of a fuse array in accordance with an embodiment of the present invention.

As illustrated in FIG. 2, an E-fuse 200 in accordance with an embodiment of the present invention may include transistors. Specifically, the E-fuse 200 may include a program transistor for programming and a select transistor for selecting a particular E-fuse. The program transistor and the select transistor may share a junction region.

The E-fuse 200 may include an active region 250 that is defined by an isolation layer formed in a substrate, and have one end serving as a floating node 210 and the other end serving as a contact node 230. The E-fuse 200 may include first and second gates 270 and 290 formed over the substrate to overlap the active region 250. The first and second gates 270 and 290 may be positioned between the floating node 210 and the contact node 230 and be separated from each other. The first gate 270 of the program transistor may be disposed adjacent to the floating gate 210. The second gate 290 of the select transistor may be disposed adjacent to the contact node 230. The floating node 210 is a source region of the program transistor and may be floated. The contact node 230 is a source region of the select transistor and may be coupled to a bit line. As described above, a gate dielectric layer (not illustrated) may be formed between the substrate and the first and second gates 270 and 290, and whether to program the E-fuse 200 is programmed may be determined by whether the gate dielectric layer, between the first gate 270 and the substrate, is broken-down.

In the embodiment of the present invention, two or more E-fuses 200 may form a fuse set and share floating node 210 or a contact node 230. This configuration will be described in detail with reference to FIGS. 3A and 3B.

FIG. 3A is a plan view of a fuse set including plurality of E-fuses that share a floating node.

Referring to FIG. 3A, the fuse set 300 may include two E-fuses which share a floating node 210. The fuse set 300 may include an active region 250 which is defined by an isolation layer(not shown), formed in a substrate that has both ends serving as contact nodes 230 and a center that serves as a floating node 210. The fuse set 300 may include first and second gates 270 and 290 that are formed over the substrate and overlap the active region 250. The first and second gates 270 and 290 may be positioned between the floating node 210 and the contact nodes 230 and be separated from each other. Specifically, the first gates 270 of the fuse set 300 may be positioned to face each other around the floating node 210, and the contact nodes 230 may be positioned at both ends of the fuse set 300. Furthermore, each of the second gates 290 may be disposed between the first gates 270 and the contact nodes 230. Over each of the contact nodes 230 of the fuse set 300, a contact plug 231 may be formed. The contact plug 231 may serve to electrically couple a conductive line and the fuse set. In the fuse set 300, two E-fuses may be arranged symmetrically with each other, around the floating node 210.

FIG. 3B is a plan view of a fuse set including a plurality of E-fuses in which a contact node is shared.

Referring to FIG. 3B, the fuse set 400 may include two E-fuses in which a contact node 230 is shared. The fuse set 400 may include an active region 250, which is defined by an isolation layer(not shown) formed in a substrate, and two ends which serve as floating nodes 210 and a center which serves as a the contact node 230. The fuse set 400 may include first and second gates 270 and 290 formed over the substrate that overlap with the active region 250. The first and second gates 270 and 290 may be formed between the contact node 230 and the floating nodes 210 and be separated from each other. Specifically, the second gates 290 of the fuse set 400 may be positioned to face each other based around the contact node 230, and the floating nodes 210 may be positioned at both ends of the fuse set 400. Furthermore, each of the first gates 270 may be disposed between the second gate 290 and the floating node 210. Over the contact node 230 shared by the two E-fuses, a contact plug 231 may be formed. The contact plug 231 may serve to electrically couple a conductive line and the fuse set 400. In the fuse set 400, two E-fuses may be arranged symmetrically with each other, based around the contact plug 231.

Referring to FIG. 4, a fuse array in which a plurality of fuse sets 300 each sharing floating nodes and a plurality of fuse sets 400 each sharing contact nodes are arranged in an array will be described.

FIG. 4 is a plan view of a fuse array in accordance with an embodiment of the present invention.

As illustrated in FIG. 4, the fuse array in accordance with an embodiment of the present invention may include a plurality of first fuse sets 300 and a plurality of second fuse sets 400. Each of the first fuse sets 300 may include a plurality of E-fuses 200 that share a floating node 210. Each of the second fuse sets 400 may include a plurality of E-fuses 200 that share a contact node 230. The fuse array may include a plurality of first conductive lines PL and a plurality of second conductive lines SL. The plurality of first conductive lines PL may be extended in the first direction D1 and be coupled to a plurality of first gates 270 positioned on the same line, and the plurality of second conductive lines SL may be extended in the first direction D1 and be coupled to a plurality of second gates 290 positioned on the same line. The fuse array may further include a plurality of third conductive lines BL that are extended in the first direction D1 and are coupled to a plurality of contact plugs 231 positioned on the same line. The fuse array may further include a plurality of strapping contact plugs 500 coupled to first conductive lines PL or second conductive lines SL that are extended between a plurality of first fuse sets 300 and a plurality of second fuse sets 400.

Each of the first fuse sets 300 may have a floating node 210 formed in the center thereof and contact nodes 230 formed at both ends thereof in the second direction D2. The first fuse set 300 may include first gates 270 and second gates 290. The first gates 270 may be disposed to face each other in the second direction D2 while sharing the floating node 210, and each of the second gates 290 may be disposed between the first gates 270 and the contact nodes 230. Over each of the contact nodes 230 of the first fuse set 300, a contact plug 231 may be formed.

Each of the second fuse sets 400 may have a contact node 230 formed in the center thereof and floating nodes 210 formed at both ends thereof in the second direction D2. The second fuse set 400 may include second gates 290 and first gates 270. The second gates 290 may be disposed to face each other in the second direction D2 while sharing the contact node 230, and each of the first gates 270 may be disposed between the second gates 290 and the floating node 210. Over the contact node 230 of the second fuse set 400, a contact plug 231 may be formed.

Furthermore, the fuse array may include a strapping contact plug 500 between each of the first fuse sets 300 and each of the second fuse sets 400.

The fuse array in accordance with the embodiment of the present invention may include a plurality of first fuse sets and a plurality of second fuse sets 300 and 400 which are arranged in a staggered fashion in the first direction D1. The plurality of first fuse sets and the plurality of second fuse sets 300 and 400 may be arranged in a linear fashion in the second direction D2, which crosses the first direction D1 (e.g. is substantially perpendicular to the first direction D1). Furthermore, the plurality of first and second fuse sets 300 and 400 may be alternately arranged in the first direction D1 and the second direction D2. The strapping contact plug 500 may be disposed between the contact nodes 230 formed at the ends of each of the first fuse sets 300 and the floating nodes 210 formed at the ends of the each second fuse sets 400.

The arrangement of the fuse array will be described with reference to regions A and B. In the region A, a first fuse set 300 is disposed to face a second fuse set 400 in the second direction D2 and another first fuse set 300 in the first direction D1. However, the two first fuse sets 300 are facing each other in a staggered fashion in the first direction D1. In the region A, a second gate 290 disposed at one end of either first fuse set 300 may be electrically coupled to a second gate 290 disposed at the other end of another first fuse set 300. Furthermore, first and second gates 270 and 290 at the other end of either of the first fuse sets 300 may be electrically coupled to first and second gates 270 and 290 at one end of a second fuse set 400.

In the region B, one of the second fuse sets 400 is disposed to face a first fuse set 300 in the second direction D2 and another second fuse set 400 in the first direction D1. However, the two second fuse sets 300 are facing each other in a staggered fashion in the first direction D1. In the region B, first and second gates 270 and 290 disposed at one end of a second fuse set 400 may be electrically coupled to first and second gates 270 and 290 disposed at the other end of one of the first fuse sets 300. Furthermore, a first gate 270 at the other end of one of the second fuse sets 400 may be electrically coupled to a first gate 270 at one end of another second fuse set 400.

In the fuse array in accordance with the embodiment of the present invention, the regions A and B may be extended and arranged in the first direction D1, and alternately disposed in the second direction D2.

Now the arrangement of the plurality of first and second conductive lines PL and SL will be described. In the fuse array, the plurality of first conductive lines PL and the plurality of second conductive lines SL may be spaced apart from each other in the second direction D2. Specifically, a pair of second conductive lines SL may be positioned at both sides of any one of the first conductive lines PL in the second direction D2, and a pair of first conductive lines PL may be positioned at both sides of any one of the second conductive lines SL in the second direction D2.

The third conductive line BL may be positioned at both sides of the second conductive lines SL in the second direction D2 or positioned between the second conductive lines SL.

In the fuse array in accordance with the embodiment of the present invention, the plurality of first fuse sets 300 and the plurality of second fuse sets 400 may be arranged in a staggered fashion in a second direction D2 and in a linear fashion n a first direction D1 to form a plurality of spaces between the first fuse sets 300 and the second fuse sets 400. This space may be formed over the isolation layer, instead of the active region 250, because the first and second fuse sets 300 and 400 are formed in a staggered fashion. In the spaces, a plurality of strapping plugs 500 may be formed to strap the first and second conductive lines PL and SL. Thus, the plurality of strapping contact plugs 500 may be arranged in a staggered fashion in the first direction D1 and the second direction D2. Each of the strapping contact plugs 500 may be coupled to a second conductive line SL adjacent to any one first conductive lines PL, which is, between a pair of second conductive lines SL. Furthermore, the strapping contact plug 500 may be coupled to a first conductive line PL adjacent to any one second conductive line SL, which is, between a pair of first conductive lines PL.

In the fuse array in accordance with the embodiment of the present invention, the first fuse sets 300 each sharing a floating node 210 and the second fuse sets 400 each sharing a contact node 230 are mixed. Thus, the integration degree of the fuse array may be increased. Furthermore, as the first fuse sets 300, each sharing a floating node 210, and the second fuse sets 400, each sharing a contact node 230, are disposed in a staggered fashion, a space may be formed between the first and second fuse sets 300 and 400. In this space, the strapping contact plug 500 may be disposed. Thus, since no separate strap region needs to be formed between the active regions 250, unlike the fuse array seen in the comparative example, the integration degree of the fuse array may be further increased.

In the fuse array in accordance with the comparative example, one strapping contact plug 500 per several tens of fuse sets is formed on one first conductive line PL. In the fuse array in accordance with the embodiment of the present invention, however, the strapping contact plug 500 may be formed between each of the first fuse sets 300 and each of the second fuse sets 400. That is, since a larger number of strapping contact plugs 500 may be formed utilizing the inventive concept than in the fuse array seen in the comparative example, compensation for drops in voltage may be improved. Furthermore, as the strapping contact plugs 500 are coupled to the plurality of first and second conductive lines PL and SL coupled to the plurality of first and second fuse sets 300 and 400, respectively, it is possible to compensate for voltage drops in both of the conductive lines. As a result, the resistance of the first and second conductive lines PL and SL arranged in the fuse array may be reduced to improve the overall signal transmission characteristics.

Although various embodiments have been described for illustrative purposes, it will be apparent to those skilled in the art that various changes and modifications may be made without departing from the spirit and scope of the invention as defined in the following claims.

What is claimed is:

1. A fuse array comprising:
   an E-fuse including an active region, a floating node and a contact node;

a plurality of gates overlapping the active region and separated from each other between the floating node and the contact node; and a plurality of fuse sets each comprising two or more E-fuses that share the floating node or the contact node.

2. The fuse array of claim 1, wherein the plurality of fuse sets is arranged in a staggered fashion in one direction.

3. The fuse array of claim 1, wherein, in each E-fuse, the floating node is positioned at one end of the active region and the contact node is positioned at the other end of the active region.

4. The fuse array of claim 3, wherein the plurality of gates include a first gate and a second gate, and in each E-fuse, the first gate is disposed adjacent to the floating node and over the active region, and the second gate is disposed adjacent to the contact node and over the active region.

5. The fuse array of claim 4, wherein the plurality of fuse sets comprise:

a plurality of first fuse sets in which E-fuses share the floating node such that the first gates face each other and the contact nodes are positioned at opposite ends of each of the first fuse sets; and a plurality of second fuse sets in which E-fuses share the contact node such that the second gates face each other and the floating nodes are positioned at opposite ends of the second fuse sets.

6. A fuse array comprising:

a plurality of active regions each having two ends defined as a floating node and a contact node, respectively, and a plurality of E-fuses having first and second gates overlapping the respective active regions that are separated from each other between the floating node and the contact node, wherein the fuse array comprises a plurality of first fuse sets, each having two or more E-fuses that share the floating node, and a second plurality of second fuse sets, each having two or more E-fuses that share the contact node, and the plurality of first fuse sets and the plurality of second fuse sets are arranged in a staggered fashion in a first direction.

7. The fuse array of claim 6, further comprising:

a plurality of first conductive lines extended in the first direction that are coupled to the plurality of first gates;

a plurality of second conductive lines extended in the first direction that are coupled to the plurality of second gates positioned on the same line; and a plurality of strapping contact plugs coupled to the first conductive lines and the second conductive lines which are extended between the plurality of first fuse sets and the plurality of second fuse sets.

8. The fuse array of claim 7, wherein the plurality of first conductive lines and the plurality of second conductive lines are separated from each other in a second direction, which crosses the first direction, and the plurality of strapping contact plugs are positioned between the plurality of first fuse sets and the plurality of second fuse sets in the second direction.

9. The fuse array of claim 6 further comprising:

a contact plug formed over each of the contact nodes; and a plurality of third conductive lines extended in the first direction and coupled to the contact plugs.

10. The fuse array of claim 6, wherein the first and second fuse sets are alternately arranged in the first direction and a second direction that crosses the first direction.

11. The fuse array of claim 6, wherein in a second direction that crosses the first direction, each of the first fuse sets shares the floating node such that the first gates face each other and the contact nodes are positioned at opposite ends of each of the first fuse sets, and each of the second fuse sets shares the contact node such that the second gates face each other and the floating nodes are positioned at opposite ends of the fuse set.

12. The fuse army of claim 6, wherein any one of the first fuse sets faces the second fuse set and another first fuse set in the first direction, the second gate disposed at one end of the any one first fuse set is electrically coupled to the second gate at the other end of the another first fuse set, and the first and second gates at the other end of the any one first fuse set are electrically coupled to the first and second gates at one end of the second fuse set.

13. The fuse array of claim 6, wherein any one of the second fuse sets face the first fuse set and another second fuse set in the first direction, the first and second gates disposed at one end of the any one second fuse set are electrically coupled to first and second gates at the other end of the first fuse set, and the first gate at the other end of the any one second fuse set is electrically coupled to the first gate at one end of the another second fuse set.

14. A fuse array which includes a plurality of active regions each having two ends, defined as a floating node and a contact node, respectively, a plurality of E-fuses having first and second gates overlapping the respective active regions, wherein the first and second gates are separated from each other between the floating node and the contact node, a plurality of first fuse sets each having two or more E-fuses sharing the floating node, and a plurality of second fuse sets each having two or more E-fuses sharing the contact node, wherein the plurality of first fuse sets and the plurality of second fuse sets are arranged in a staggered fashion in a first direction, and the fuse array comprises:

a plurality of first conductive lines extended in the first direction that are coupled to the plurality of first gates;

a plurality of second conductive lines extended in the first direction that are coupled to the plurality of second gates; and a plurality of strapping contact plugs coupled to the first and second conductive lines, which are disposed between the plurality of first fuse sets and the plurality of second fuse sets in a second direction that crosses the first direction.

15. The fuse array of claim 14, further comprising:

a contact plug formed over each of the contact nodes; and a plurality of third conductive lines extended in the first direction that are coupled to the contact plugs.

16. The fuse array of claim 15, wherein the plurality of third conductive lines are positioned at both sides of the second conductive line or between the second conductive lines in the second direction.

17. The fuse array of claim 14, wherein the first and second fuse sets are alternately arranged in the first and second directions.

18. The fuse array of claim 14, wherein the strapping contact plugs are arranged in a staggered fashion in the first and second directions.

19. The fuse array of claim 14, wherein a pair of second conductive lines are positioned at both sides of any one of the first conductive lines in the second direction, and a pair of first conductive lines are positioned at both sides of any one of the second conductive lines in the second direction.

20. The fuse array of claim 19, wherein a second conductive line adjacent to the any one first conductive line, which is, between the pair of the second conductive lines, and a first conductive line adjacent to the any one second conductive line, which is, between the pair of first conductive lines, are coupled to the strapping contact plugs.

* * * * *